United States Patent
Lin et al.

(10) Patent No.: US 11,664,774 B2
(45) Date of Patent: May 30, 2023

(54) OPERATIONAL AMPLIFIER USING SINGLE-STAGE AMPLIFIER WITH SLEW-RATE ENHANCEMENT AND ASSOCIATED METHOD

(71) Applicant: MEDIATEK INC., Hsin-Chu (TW)

(72) Inventors: Yu-Hung Lin, Hsinchu (TW); Kuan-Ta Chen, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 17/736,062

(22) Filed: May 3, 2022

(65) Prior Publication Data
US 2022/0263480 A1 Aug. 18, 2022

Related U.S. Application Data

(63) Continuation of application No. 16/921,922, filed on Jul. 6, 2020.

(60) Provisional application No. 62/898,121, filed on Sep. 10, 2019.

(51) Int. Cl.
  *H03F 3/45* (2006.01)
(52) U.S. Cl.
  CPC .......... *H03F 3/45179* (2013.01); *H03F 2203/45248* (2013.01); *H03F 2203/45508* (2013.01)
(58) Field of Classification Search
  CPC ................................................. H03F 3/45269
  See application file for complete search history.

(56) References Cited

U.S. PATENT DOCUMENTS

| 5,729,178 | A | 3/1998 | Park |
| 7,071,778 | B2 * | 7/2006 | Butler ............ H03F 3/005 |
| | | | 330/261 |
| 8,089,314 | B2 | 1/2012 | Thakker |
| 8,217,721 | B1 | 7/2012 | Hsieh |
| 9,013,234 | B2 | 4/2015 | Misawa |
| 2006/0049873 | A1 | 3/2006 | Britton, Jr. |

(Continued)

FOREIGN PATENT DOCUMENTS

| TW | I384751 B1 | 2/2013 |
| TW | 201622342 A | 6/2016 |

OTHER PUBLICATIONS

Mahmoudidaryan, Wideband Hybrid Envelope Tracking Modulator With Hysteretic-Controlled Three-Level Switching Converter and Slew-Rate Enhanced Linear Amplifier, IEEE Journal of Solid-State Circuits, vol. 54, No. 12, pp. 3336-3347, Dec. 2019.

(Continued)

*Primary Examiner* — Patricia T Nguyen
(74) *Attorney, Agent, or Firm* — Winston Hsu

(57) ABSTRACT

An operational amplifier includes a single-stage amplifier and a current controller. The single-stage amplifier receives an input signal, and amplifies the input signal to generate an output signal, wherein the single-stage amplifier includes a voltage controlled current source circuit that operates in response to a bias voltage input. The current controller receives the input signal, and generates the bias voltage input according to the input signal. The bias voltage input includes a first bias voltage, a second bias voltage, a third bias voltage, and a fourth bias voltage. None of the first bias voltage, the second bias voltage, the third bias voltage, and the fourth bias voltage is directly set by the input signal of the single-stage amplifier.

12 Claims, 8 Drawing Sheets

(56) References Cited

U.S. PATENT DOCUMENTS

| | | | |
|---|---|---|---|
| 2006/0232339 A1* | 10/2006 | DeMonte | H03G 1/0023 |
| | | | 330/285 |
| 2007/0229156 A1 | 10/2007 | Alenin | |
| 2007/0247347 A1* | 10/2007 | Matsui | H03M 1/002 |
| | | | 341/155 |
| 2010/0134186 A1 | 6/2010 | Chung | |
| 2013/0307623 A1 | 11/2013 | Dusad | |
| 2014/0197887 A1 | 7/2014 | Hovesten | |
| 2014/0197888 A1* | 7/2014 | Rajaee | H03F 1/223 |
| | | | 330/261 |
| 2015/0061767 A1* | 3/2015 | Francis | H03F 3/45183 |
| | | | 330/258 |
| 2020/0412303 A1* | 12/2020 | Astgimath | H03F 3/45094 |

OTHER PUBLICATIONS

H. Naderi, Operational Transconductance Amplifier With Class-B Slew-Rate Boosting for Fast High-Performance Switched Capacitor Circuits, IEEE Transactions on Circuits and Systems-I: Regular Papers, vol. 65, No. 11, pp. 3769-3779, Nov. 2018.

* cited by examiner

OPERATIONAL AMPLIFIER USING SINGLE-STAGE AMPLIFIER WITH SLEW-RATE ENHANCEMENT AND ASSOCIATED METHOD

CROSS REFERENCE TO RELATED APPLICATION

This application is a continuation application of U.S. application Ser. No. 16/921,922, filed on Jul. 6, 2020, which claims the benefit of U.S. Provisional Application No. 62/898,121, filed on Sep. 10, 2019. The contents of these applications are incorporated herein by reference.

BACKGROUND

The present invention relates to amplifying an input signal to generate an output signal, and more particularly, to an operational amplifier using a single-stage amplifier with slew-rate enhancement (e.g., Class-AB slew-rate enhancement) and an associated method.

It will be appreciated that, generally speaking, the most efficient type of operational amplifier is a single-stage amplifier with a single pole. High bandwidth and low noise can be easily implemented by the single-stage amplifier. However, the single-stage amplifier has limitations in slew rate. The slew rate of an operational amplifier represents the maximum rate of change of a signal at any point in the circuit. In other words, limitations in slew rate may result in non-linear effects that may significantly distort an amplifier output if an amplifier input is at a frequency exceeding the slew rate limitation of the operational amplifier.

SUMMARY

One of the objectives of the claimed invention is to provide an operational amplifier using a single-stage amplifier with slew-rate enhancement (e.g., Class-AB slew-rate enhancement) and an associated method.

According to a first aspect of the present invention, an exemplary operational amplifier is disclosed. The exemplary operational amplifier includes a single-stage amplifier and a current controller. The single-stage amplifier is arranged to receive an input signal and amplify the input signal to generate an output signal, wherein the single-stage amplifier comprises a voltage controlled current source circuit that operates in response to a bias voltage input. The current controller, coupled to the voltage controlled current source circuit, wherein the current controller is arranged to receive the input signal, and generate the bias voltage input according to the input signal. The bias voltage input includes a first bias voltage, a second bias voltage, a third bias voltage, and a fourth bias voltage. None of the first bias voltage, the second bias voltage, the third bias voltage, and the fourth bias voltage is directly set by the input signal of the single-stage amplifier.

According to a second aspect of the present invention, an exemplary signal amplification method is disclosed. The exemplary signal amplification method includes: generating a bias voltage input according to an input signal; and amplifying, by a single-stage amplifier, the input signal to generate an output signal, wherein the single-stage amplifier comprises a voltage controlled current source circuit that operates in response to the bias voltage input. The bias voltage input includes a first bias voltage, a second bias voltage, a third bias voltage, and a fourth bias voltage. None of the first bias voltage, the second bias voltage, the third bias voltage, and the fourth bias voltage is directly set by the input signal of the single-stage amplifier.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
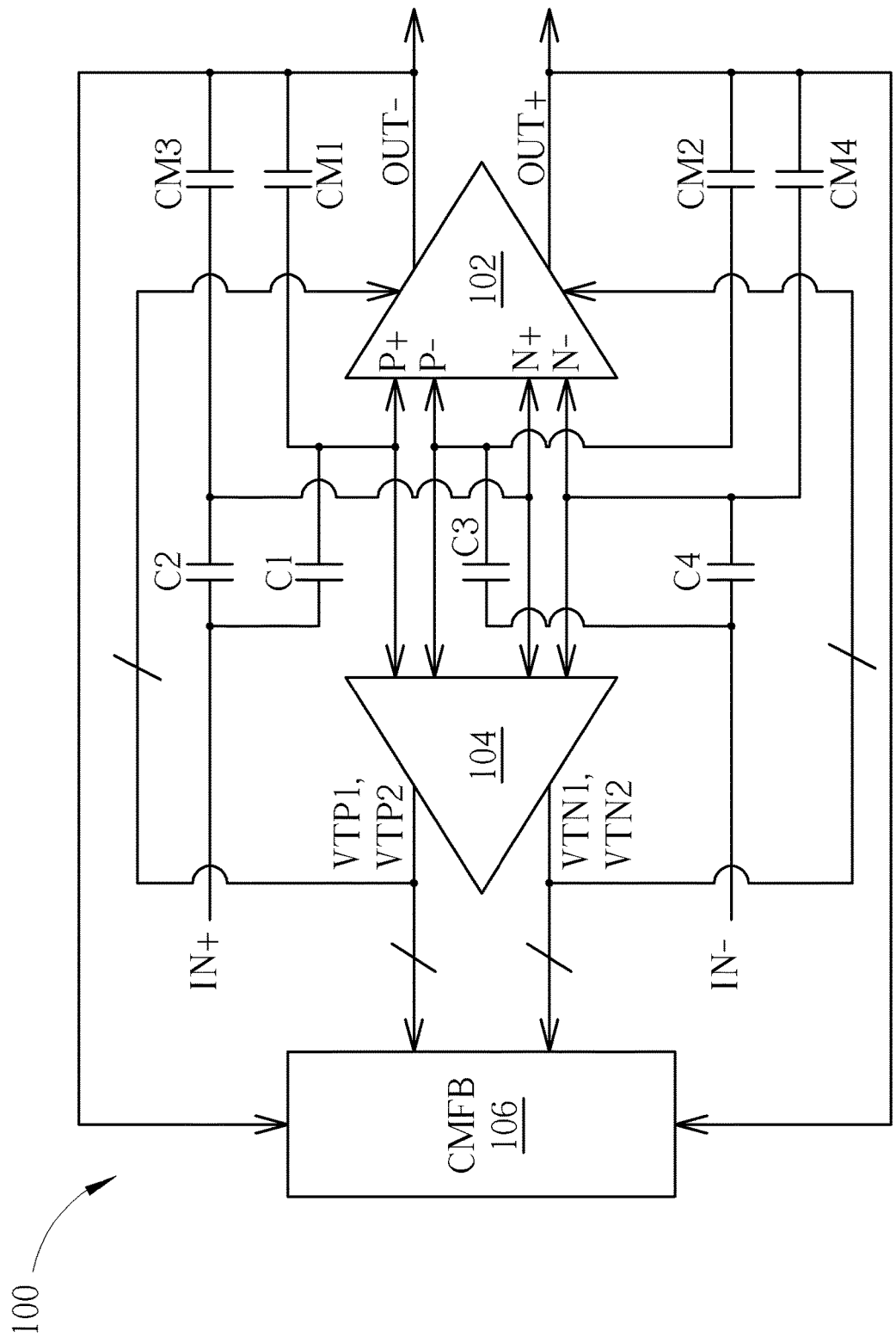
FIG. 1 is a diagram illustrating an operational amplifier according to an embodiment of the present invention.

FIG. 1 is a diagram illustrating an operational amplifier according to an embodiment of the present invention. The operational amplifier 100 includes a single-stage amplifier 102, a current controller 104, and a common-mode feedback circuit (CMFB) 106. The common-mode feedback circuit 106 may be optional. For example, when the single-stage amplifier 102 is a single-ended amplifier, the common-mode feedback circuit 106 may be omitted. For better understanding of technical features of the present invention, the following assumes that the single-stage amplifier 102 is a fully differential amplifier.

The single-stage amplifier 102 is arranged to receive an input signal and amplify the input signal to generate an output signal. For example, the single-stage amplifier 102 is a differential amplifier, such that the input signal is a differential signal consisting of a positive signal IN+ and a negative signal IN−, and the output signal is a differential signal consisting of a positive signal OUT+ and a negative signal OUT−. In some embodiments of the present invention, the single-stage amplifier 102 may be implemented by a telescopic amplifier.

Figure 2:
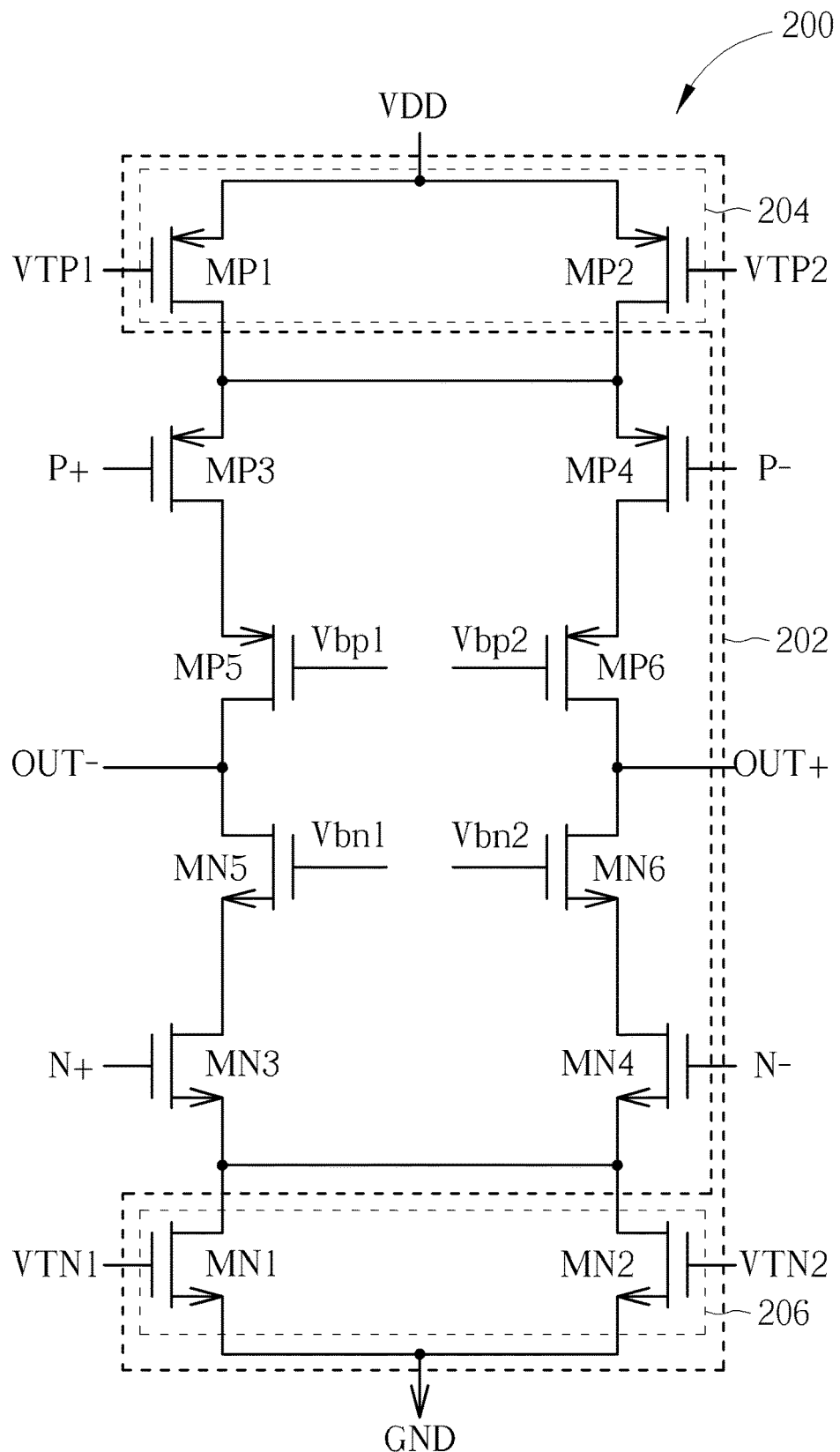
FIG. 2 is a diagram illustrating a telescopic amplifier according to an embodiment of the present invention.

FIG. 2 is a diagram illustrating a telescopic amplifier according to an embodiment of the present invention. The single-stage amplifier 102 shown in FIG. 1 may be implemented by the telescopic amplifier 200 shown in FIG. 2. As shown in FIG. 2, the telescopic amplifier 200 includes P-channel metal-oxide semiconductor (PMOS) transistors MP1, MP2, MP3, MP4, MP5, MP6 and N-channel metal-oxide semiconductor (NMOS) transistors MN1, MN2, MN3, MN4, MN5, MN6. The PMOS transistors MP1, MP3, MP5 and NMOS transistors MN1, MN3, MN5 are cascoded between two reference voltages including a supply voltage VDD and a ground voltage GND, where VDD>GND. In addition, the PMOS transistors MP2, MP4, MP6 and NMOS transistors MN2, MN4, MN6 are cascoded between two reference voltages including the supply voltage VDD and the ground voltage GND.

A source node of the PMOS transistor MP1 is arranged to receive one reference voltage (e.g., supply voltage VDD), and a gate node of the PMOS transistor MP1 is arranged to receive a bias voltage VTP1. A source node of the PMOS transistor MP2 is arranged to receive one reference voltage (e.g., supply voltage VDD), and a gate node of the PMOS transistor MP2 is arranged to receive a bias voltage VTP2. A source node of the NMOS transistor MN1 is arranged to receive another reference voltage (e.g., ground voltage GND), and a gate node of the NMOS transistor MN1 is arranged to receive a bias voltage VTN1. A source node of the NMOS transistor MN2 is arranged to receive another reference voltage (e.g., ground voltage GND), and a gate node of the NMOS transistor MN2 is arranged to receive a bias voltage VTN2.

A gate node of the PMOS transistor MP3 is arranged to receive a positive signal P+ (P+=IN+), and a gate node of the PMOS transistor MP4 is arranged to receive a negative signal P− (P−=IN−), where the positive signal P+ and the negative signal P− form one differential signal. In addition, a gate node of the NMOS transistor MM3 is arranged to receive a positive signal N+ (N+=IN+), and a gate node of the NMOS transistor MN4 is arranged to receive a negative signal N− (N−=IN−), where the positive signal N+ and the negative signal N− form one differential signal. As shown in FIG. 1, the positive signals P+ and N+ are derived from the same positive signal IN+ via coupling capacitors C1 and C2, and the negative signals P− and N− are derived from the same negative signal IN− via coupling capacitors C3 and C4. Ideally, coupling capacitors C1-C4 may be identical capacitors.

A gate node of the PMOS transistor MP5 and a gate node of the NMOS transistor MN5 are arranged to receive bias voltages Vbp1 and Vbn1, respectively, and a drain node of the PMOS transistor MP5 and a drain node of the NMOS transistor MN5 are both coupled to the negative signal OUT− of the differential amplifier output. In addition, a gate node of the PMOS transistor MP6 and a gate node of the NMOS transistor MN6 are arranged to receive bias voltages Vbp2 and Vbn2, respectively, and a drain node of the PMOS transistor MP6 and a drain node of the NMOS transistor MN6 are both coupled to the positive signal OUT+ of the differential amplifier output.

The telescopic amplifier 200 has a voltage controlled current source 202, where the voltage controlled current source 202 includes a top current source 204 and a tail current source 206. The voltage controlled current source 202 operates in response to a bias voltage input that includes bias voltages VTP1, VTP2, VTN1, and VTN2, where the top current source 204 is controlled by bias voltages VTP1 and VTP2, and the tail current source 206 is controlled by bias voltages VTN1 and VTN2. In this embodiment, the current controller 104 shown in FIG. 1 is coupled to the voltage controlled current source circuit 202, and is arranged to receive the input signal (which includes positive signal IN+ and negative signal IN−, where IN+=P+=N+ and IN−=P−=N−), and generate the bias voltage input (which includes bias voltages VTP1, VTP2, VTN1, and VTN2) according to the input signal (which includes positive signal IN+ and negative signal IN−, where IN+=P+=N+ and IN−=P−=N−). Hence, the bias voltage input {VTP1, VTP2, VTN1, VTN2} is not fixed, and is dynamically adjusted in response to the input signal {IN+, IN−}.

Figure 3:
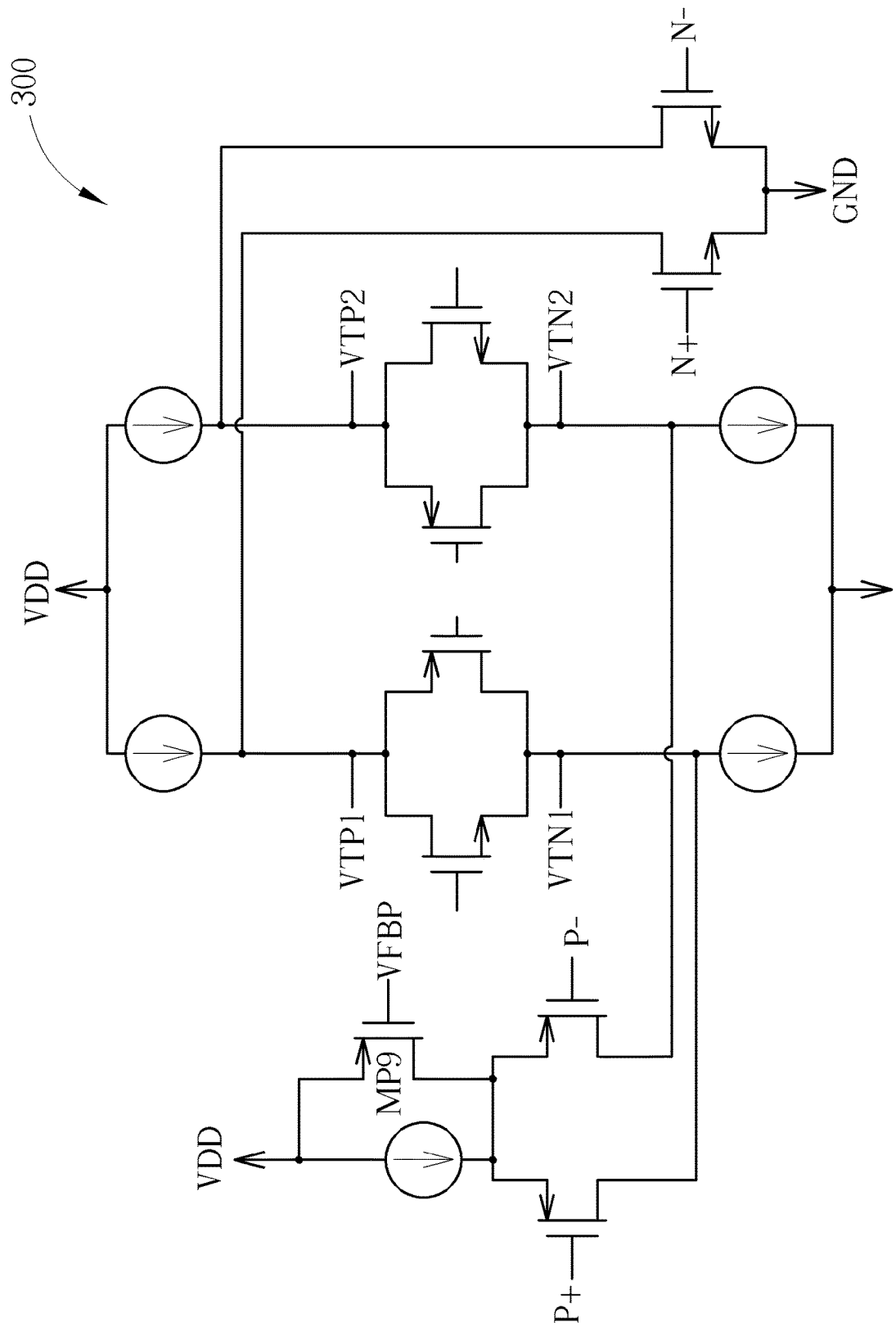
FIG. 3 is a diagram illustrating a current controller according to an embodiment of the present invention.

FIG. 3 is a diagram illustrating a current controller according to an embodiment of the present invention. The current controller 104 shown in FIG. 1 may be implemented by the current controller 300. The bias voltage input dynamically adjusted by the current controller 300 enables Class-AB slew-rate enhancement for the voltage controlled current source circuit 202 of the telescopic amplifier 200 that is a single-stage amplifier.

Figure 4:
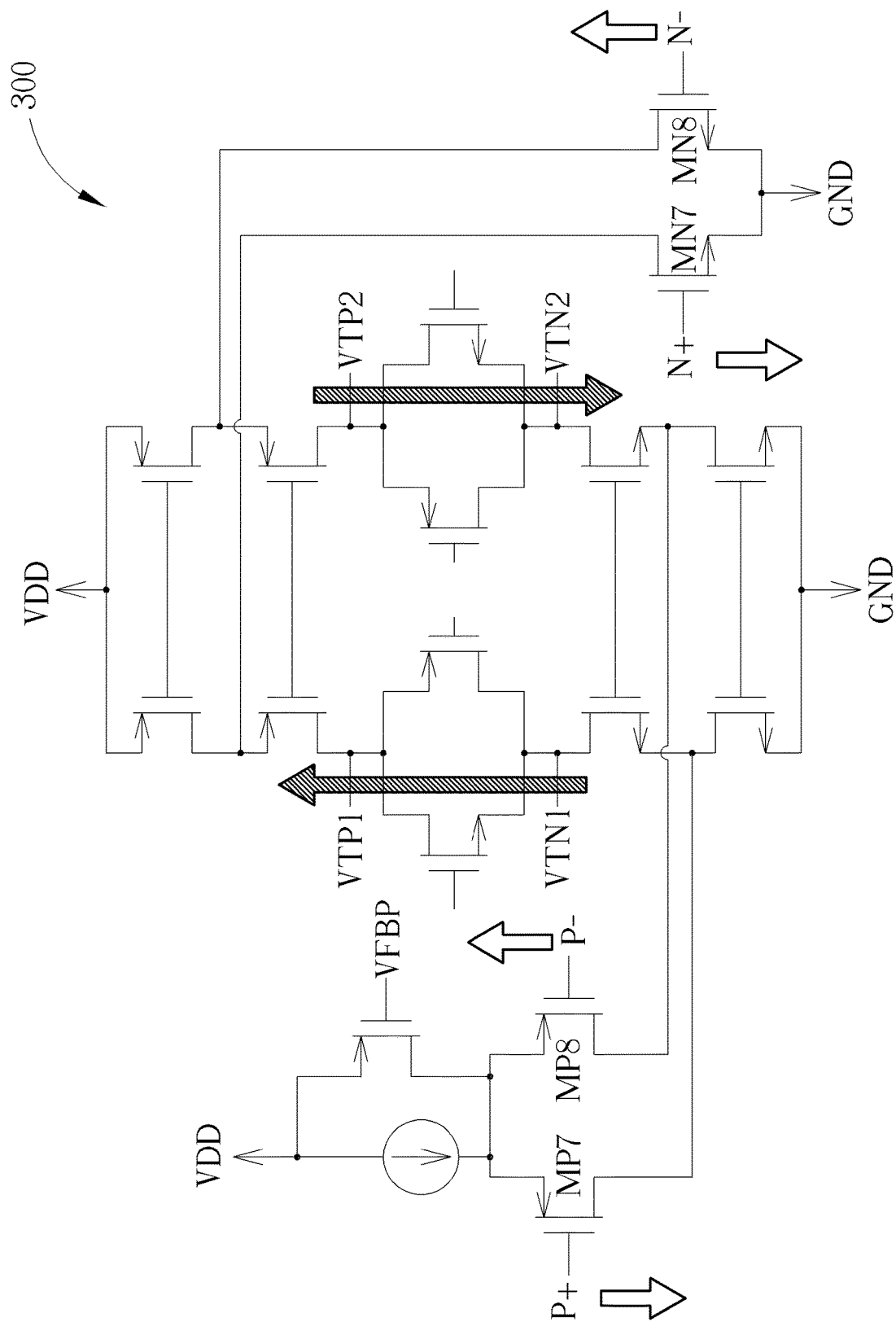
FIG. 4 is a diagram illustrating the current controller shown in FIG. 3 that operates under a condition that a voltage level of a positive signal is lower than a voltage level of a negative signal.
Figure 5:
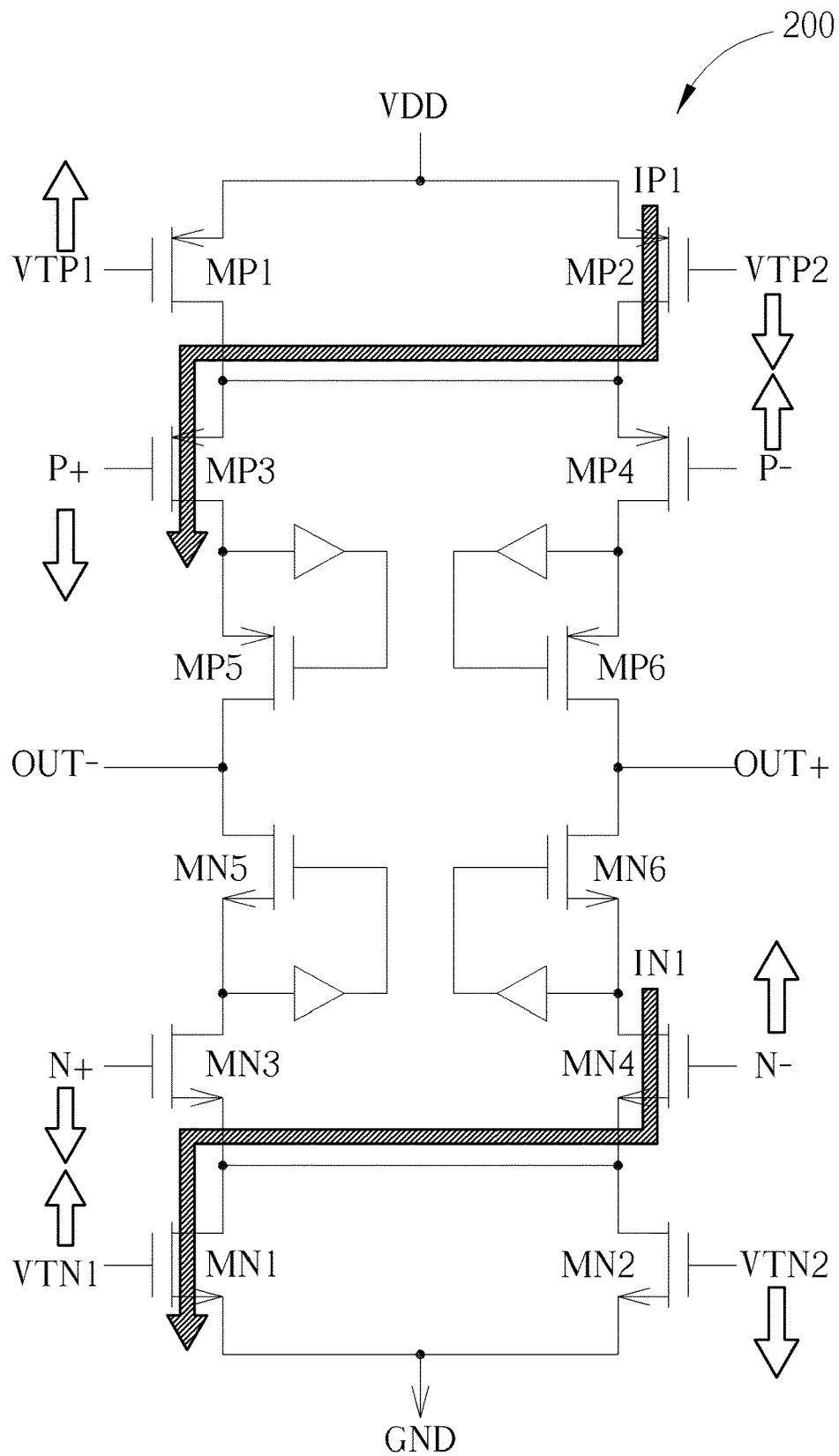
FIG. 5 is a diagram illustrating the telescopic amplifier shown in FIG. 2 that operates under a condition that the voltage level of the positive signal is lower than the voltage level of the negative signal.

Please refer to FIG. 4 in conjunction with FIG. 5. FIG. 4 is a diagram illustrating the current controller 300 operating under a condition that a voltage level of the positive signal IN+ is lower than a voltage level of the negative signal IN−. FIG. 5 is a diagram illustrating the telescopic amplifier 200 operating under a condition that the voltage level of the positive signal IN+ is lower than the voltage level of the negative signal IN−. Suppose that the single-stage amplifier 102 shown in FIG. 1 is implemented by the telescopic amplifier 200 shown in FIG. 2, and the current controller 104 shown in FIG. 1 is implemented by the current control 300 shown in FIG. 3. When the voltage level of the positive signal IN+ becomes lower than the voltage level of the negative signal IN−, a voltage level of the positive signal P+ and a voltage level of the positive signal N+ are decreased, and a voltage level of the negative signal P− and a voltage level of the negative signal N− are increased. Hence, a voltage at a gate node of the PMOS transistor MP7 shown in FIG. 4 is decreased and a voltage at a gate node of the NMOS transistor MN7 shown in FIG. 4 is decreased due to IN+=P+=N+, and a voltage at a gate node of the PMOS transistor MP8 shown in FIG. 4 is increased and a voltage at a gate node of the NMOS transistor MN8 shown in FIG. 4 is increased due to IN−=P−=N−. The current passing through the PMOS transistor MP7 is increased, while the PMOS transistor MP8 may be turned off. In addition, the current passing through the NMOS transistor MN8 is increased, while the NMOS transistor MN7 may be turned off. Hence, the bias voltages VTP1 and VTN1 are pushed up, and the bias voltages VTP2 and VTN2 are pulled down. To put it simply, when the voltage level of the positive signal IN+ is lower than the voltage level of the negative signal IN−, the current controller 300 is arranged to increase the bias voltages VTP1 and VTN1 and decrease the bias voltages VTP2 and VTN2.

As shown in FIG. 5, the PMOS transistor MP1 may be turned off due to the increased bias voltage VTP1, the PMOS transistor MP4 may be turned off due to the increased voltage of the positive signal P−, the NMOS transistor MN3 may be turned off due to the decreased voltage of the positive signal N+, and the NMOS transistor MN2 may be turned off due to the decreased bias voltage VTN2. An output node of the negative signal OUT− may drain large current IP1 from the supply voltage VDD due to the decreased bias voltage VTP2 at the gate node of the PMOS transistor MP2 and the decreased voltage of the positive signal P+ at the gate node of the PMOS transistor MP3. In addition, large current IN1 is drained from an output node of the positive signal OUT+ to the ground voltage GND due to the increased bias voltage VTN1 at the gate node of the NMOS transistor MN1 and the increased voltage of the negative signal N− at the gate node of the NMOS transistor MN4. The bias voltages VTP1, VTP2, VTN1, and VTN2 are not fixed, and are dynamically adjusted by the current controller 300. With the help of the current controller 300, large current IP1 and IN1 can be provided to enhance the slew rate of the telescopic amplifier 200 under a condition that the voltage level of the positive signal IN+ is lower than the voltage level of the negative signal IN−.

Figure 6:
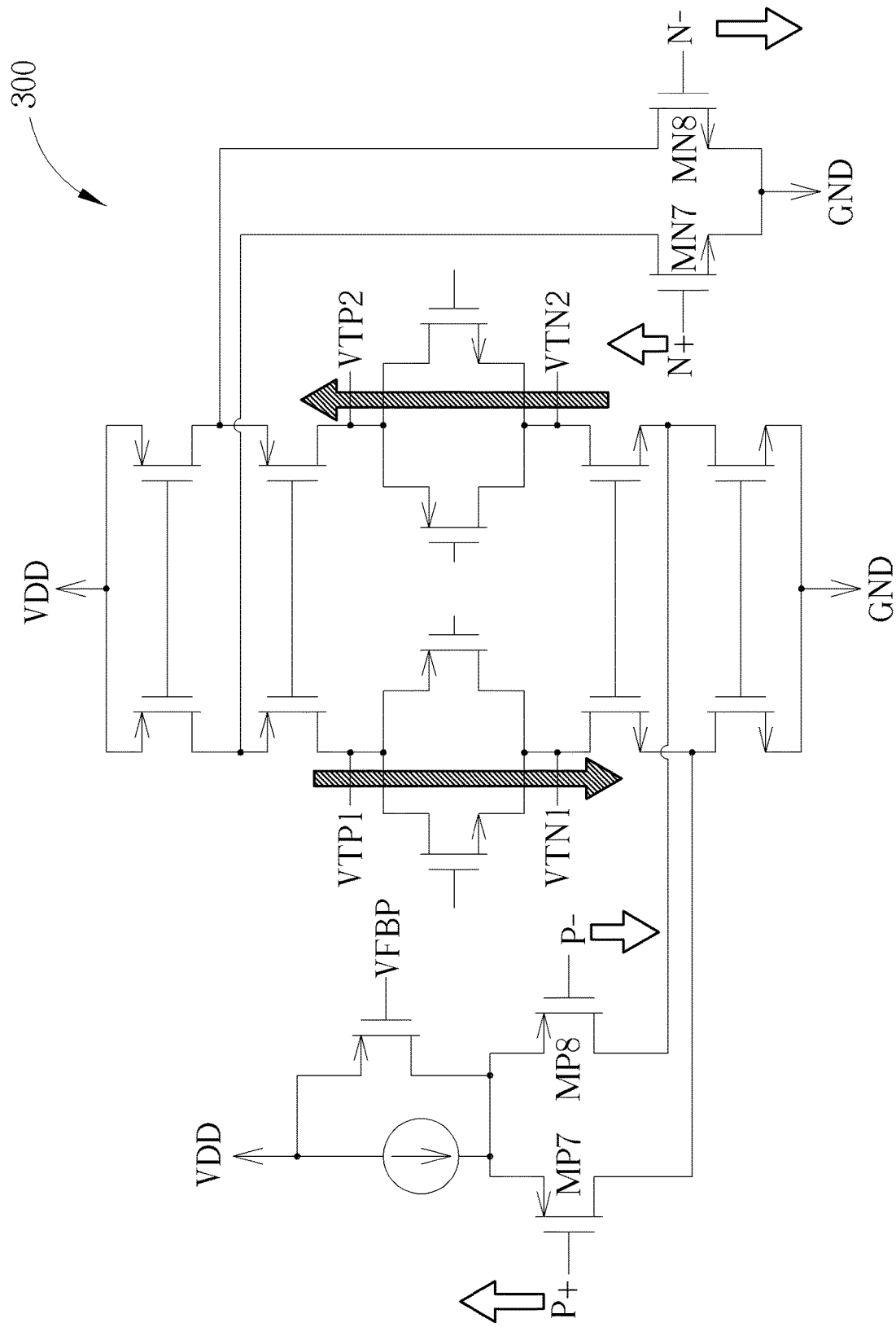
FIG. 6 is a diagram illustrating the current controller shown in FIG. 3 that operates under a condition that the voltage level of the positive signal is higher than the voltage level of the negative signal.
Figure 7:
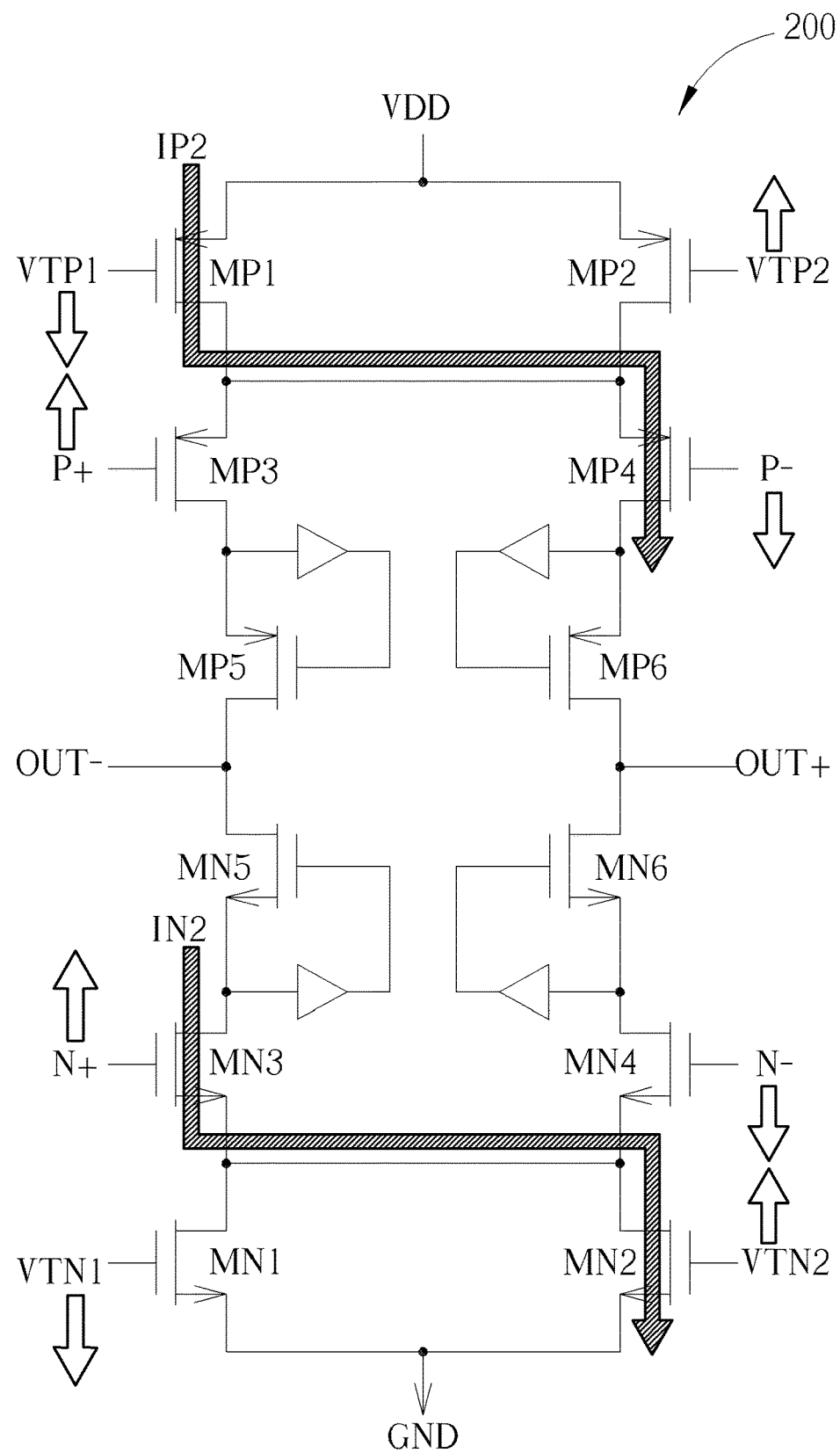
FIG. 7 is a diagram illustrating the telescopic amplifier shown in FIG. 2 that operates under a condition that the voltage level of the positive signal is higher than the voltage level of the negative signal.

Please refer to FIG. 6 in conjunction with FIG. 7. FIG. 6 is a diagram illustrating the current controller 300 operating under a condition that a voltage level of the positive signal IN+ is higher than a voltage level of the negative signal IN−. FIG. 7 is a diagram illustrating the telescopic amplifier 200 operating under a condition that the voltage level of the positive signal IN+ is higher than the voltage level of the negative signal IN−. Suppose that the single-stage amplifier 102 shown in FIG. 1 is implemented by the telescopic amplifier 200 shown in FIG. 2, and the current controller 104 shown in FIG. 1 is implemented by the current control 300 shown in FIG. 3. When the voltage level of the positive signal IN+ becomes higher than the voltage level of the negative signal IN−, a voltage level of the positive signal P+ and a voltage level of the positive signal N+ are increased, and a voltage level of the negative signal P− and a voltage level of the negative signal N− are decreased. Hence, a voltage at a gate node of the PMOS transistor MP7 shown in FIG. 6 is increased and a voltage at a gate node of the NMOS transistor MN7 shown in FIG. 6 is increased due to IN+=P+=N+, and a voltage at a gate node of the PMOS transistor MP8 shown in FIG. 6 is decreased and a voltage at a gate node of the NMOS transistor MN8 shown in FIG. 6 is decreased due to IN−=P−=N−. The current passing through the PMOS transistor MP8 is increased, while the PMOS transistor MP7 may be turned off. In addition, the current passing through the NMOS transistor MN7 is increased, while the NMOS transistor MN8 may be turned off. Hence, the bias voltages VTP1 and VTN1 are pulled down, and the bias voltages VTP2 and VTN2 are pushed up. To put it simply, when the voltage level of the positive signal IN+ is higher than the voltage level of the negative signal IN−, the current controller 300 is arranged to decrease the bias voltages VTP1 and VTN1 and increase the bias voltages VTP2 and VTN2.

As shown in FIG. 7, the PMOS transistor MP2 may be turned off due to the increased bias voltage VTP2, the PMOS transistor MP3 may be turned off due to the increased voltage of the positive signal P+, the NMOS transistor MN4 may be turned off due to the decreased voltage of the negative signal N−, and the NMOS transistor MN1 may be turned off due to the decreased bias voltage VTN1. An output node of the positive signal OUT+ may drain large current IP2 from the supply voltage VDD due to the decreased bias voltage VTP1 at the gate node of the PMOS transistor MP1 and the decreased voltage of the positive signal P− at the gate node of the PMOS transistor MP4. In addition, large current IN2 is drained from an output node of the negative signal OUT− to the ground voltage GND due to the increased bias voltage VTN2 at the gate node of the NMOS transistor MN2 and the increased voltage of the positive signal N+ at the gate node of the NMOS transistor MN3. The bias voltages VTP1, VTP2, VTN1, and VTN2 are not fixed, and are dynamically adjusted by the current controller 300. With the help of the current controller 300, large current IP2 and IN2 can be provided to enhance the slew rate of the telescopic amplifier 200 under a condition that the voltage level of the positive signal IN+ is higher than the voltage level of the negative signal IN−.

In this embodiment, PMOS transistors MP1, MP2 and NMOS transistors MN1, MN2 shown in FIG. 2 are biased via a floating gate current source of the current controller 300 shown in FIG. 3. As shown in FIG. 5 and FIG. 7, the class-AB control includes PMOS transistors MP3, MP4 and NMOS transistors MN3, MN4, and operates in response to the input signal {IN+=P+=N+, IN−=P−=N−}. As shown in FIG. and FIG. 6, the floating gate current source includes PMOS transistors MP7, MP8 and NMOS transistors MN7, MN8, and operates in response to the input signal {IN+=P+=N+, IN−=P−=N−}. The floating gate current source has the same structure and the same supply voltage dependency as the class-AB control, resulting in quiescent currents of PMOS transistors MP1, MP2 and NMOS transistors MN1, MN2 which are independent of the supply voltage.

Figure 8:
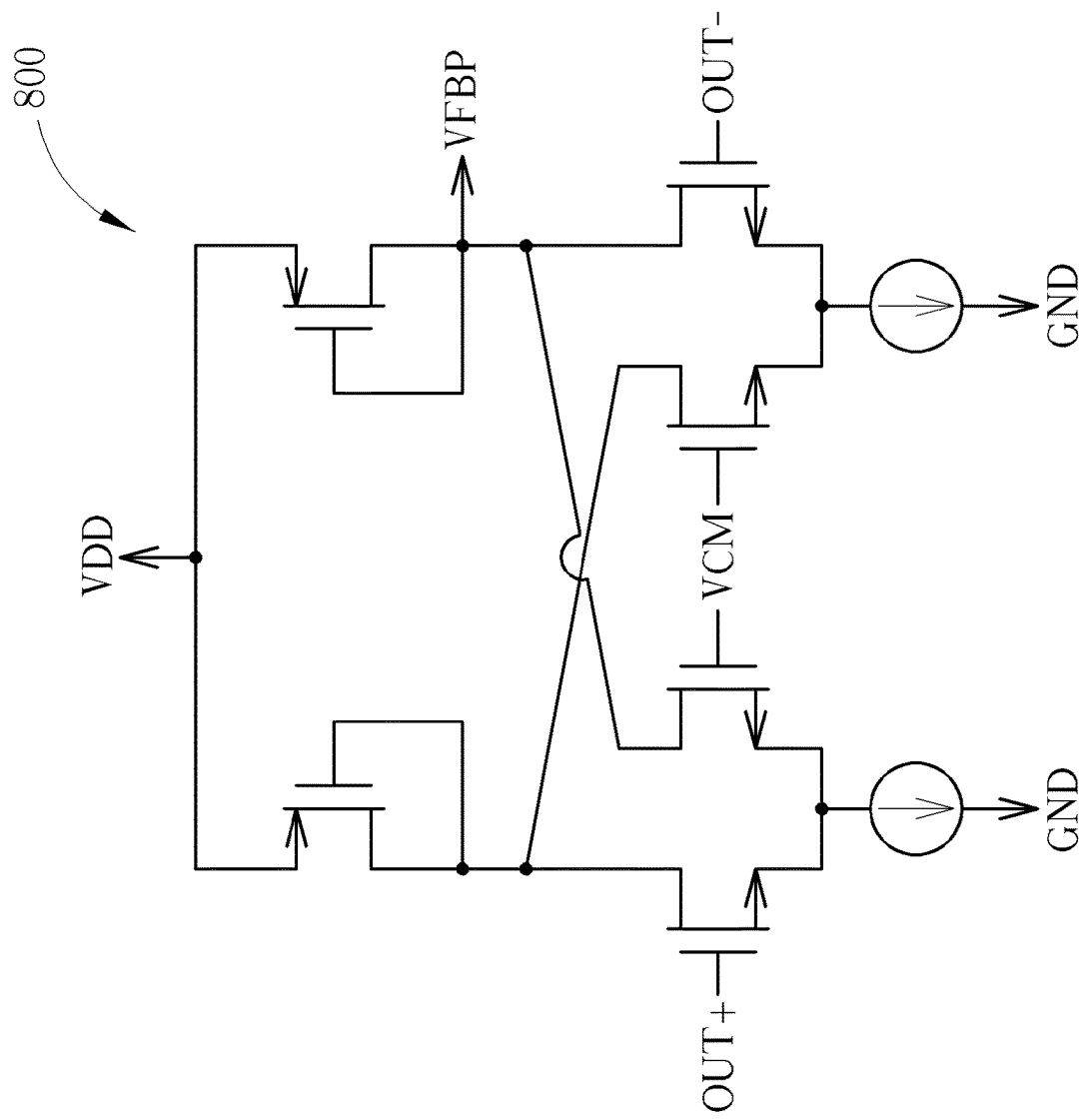
FIG. 8 is a diagram illustrating a common-mode feedback circuit according to an embodiment of the present invention.
Figure 8:
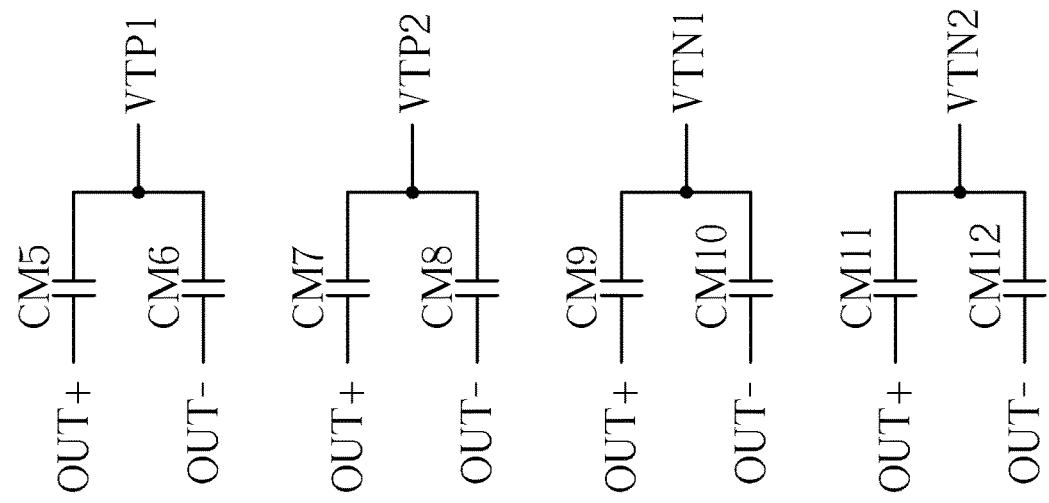

When the single-stage amplifier 102 is implemented by a fully differential amplifier, the common-mode feedback circuit 106 may be employed to minimize an offset of a common-mode voltage of a differential output {OUT+, OUT−} generated from the single-stage amplifier 102. FIG. 8 is a diagram illustrating a common-mode feedback circuit according to an embodiment of the present invention. The common-mode feedback circuit 106 shown in FIG. 1 may be implemented by the common-mode feedback circuit 800. The common-mode feedback circuit 800 is arranged to monitor a common-mode voltage of the positive signal OUT+ and the negative signal OUT−, and compare the common-mode voltage with a reference voltage VCM to generate a feedback control voltage VFBP. For example, the reference voltage VCM may be equal to half of the supply voltage VDD. Considering a case where the current controller 104 is implemented by the current controller 300 shown in FIG. 3, the current controller 300 includes a PMOS transistor MP9, and a gate node of the PMOS transistor MP9 is arranged to receive the feedback control voltage VFBP generated from the common-mode feedback circuit 800. In other words, the current controller 300 is further arranged to receive the feedback control voltage VFBP, and affect the bias voltage input {VTP1, VTP2, VTN1, VTN2} in response to the feedback control voltage VFBP.

Considering a case where the common-mode voltage is higher than the reference voltage VCM, the feedback control voltage VFBP is decreased by the common-mode feedback circuit 800, and current passing through the PMOS transistor MP9 of the current controller 300 is increased, thereby further increasing the bias voltages VTP1, VTP2, VTN1, and VTN2. With regard to the scenario shown in FIG. 5, the current IP1 passing through the PMOS transistor MP2 is decreased, while the current IN1 passing through the NMOS transistor MN4 is increased. With regard to the scenario shown in FIG. 7, the current IP2 passing through the PMOS transistor MP1 is decreased, while the current IN2 passing through the NMOS transistor MN2 is increased. In each of the scenarios, the common-mode voltage is decreased.

Considering another case where the common-mode voltage is lower than the reference voltage VCM, the feedback control voltage VFBP is increased by the common-mode feedback circuit 800, and current passing through the PMOS transistor MP9 of the current controller 300 is decreased, thereby further decreasing the bias voltages VTP1, VTP2, VTN1, and VTN2. With regard to the scenario shown in FIG. 5, the current IP1 passing through the PMOS transistor MP2 is increased, while the current IN1 passing through the NMOS transistor MN4 is decreased. With regard to the scenario shown in FIG. 7, the current IP2 passing through the PMOS transistor MP1 is increased, while the current IN2 passing through the NMOS transistor MN2 is decreased. In each of the scenarios, the common-mode voltage is increased.

The common-mode feedback circuit 800 may include an optional Miller compensation circuit that is coupled between the output signal {OUT+, OUT-} and the bias voltage input {VTP1, VTP2, VTN1, VTN2} for stability compensation of common-mode feedback loop. In this embodiment, the Miller compensation circuit may include Miller capacitors CM5, CM6, CM7, CM8, CM9, CM10, CM11, and CM12. In addition, Miller compensation may also be applied to the single-stage amplifier 102 by using Miller capacitors CM1, CM2, CM3, and CM4, as shown in FIG. 1. However, these are for illustrative purposes only, and are not meant to be limitations of the present invention.

With regard to a typical single-stage amplifier without the proposed Class-AB slew-rate enhancement scheme, it may achieve a high signal-to-noise and distortion ratio (SDNR) (e.g., 106 dB) by consuming large quiescent current (e.g., 4000 uA). Compared to the typical single-stage amplifier, the operational amplifier 100 (which includes the single-stage amplifier 102 with the proposed Class-AB slew-rate enhancement scheme) can achieve a higher SDNR (e.g., 110 dB) by consuming much less quiescent current (e.g., 740 uA), where the quiescent current of the single-stage amplifier 102 may be 640 uA, and the quiescent current of the current controller 104 may be 100 uA.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An operational amplifier comprising:
a single-stage amplifier, arranged to receive an input signal and amplify the input signal to generate an output signal, wherein the single-stage amplifier comprises a voltage controlled current source circuit that operates in response to a bias voltage input; and
a current controller, coupled to the voltage controlled current source circuit, wherein the current controller is arranged to receive the input signal, and generate the bias voltage input according to the input signal;
wherein the bias voltage input comprises a first bias voltage, a second bias voltage, a third bias voltage, and a fourth bias voltage; and none of the first bias voltage, the second bias voltage, the third bias voltage, and the fourth bias voltage is directly set by the input signal of the single-stage amplifier.

2. The operational amplifier of claim 1, wherein the bias voltage input dynamically adjusted by the current controller enables Class-AB slew-rate enhancement for the voltage controlled current source circuit.

3. The operational amplifier of claim 1, wherein the single-stage amplifier is a telescopic amplifier; and the voltage controlled current source circuit comprises:
a first P-channel metal-oxide semiconductor (PMOS) transistor, having a gate node arranged to receive the first bias voltage, and a source node arranged to receive a first reference voltage;
a second PMOS transistor, having a gate node arranged to receive the second bias voltage, and a source node arranged to receive the first reference voltage;
a first N-channel metal-oxide semiconductor (NMOS) transistor, having a gate node arranged to receive the third bias voltage, and a source node arranged to receive a second reference voltage, wherein the second reference voltage is lower than the first reference voltage; and
a second NMOS transistor, having a gate node arranged to receive the fourth bias voltage, and a source node arranged to receive the second reference voltage.

4. The operational amplifier of claim 3, wherein the input signal is a differential signal including a positive signal and a negative signal; when a voltage level of the positive signal is lower than a voltage level of the negative signal, the current controller is arranged to increase the first bias voltage and the third bias voltage, and decrease the second bias voltage and the fourth bias voltage; and when the voltage level of the positive signal is higher than the voltage level of the negative signal, the current controller is arranged to decrease the first bias voltage and the third bias voltage, and increase the second bias voltage and the fourth bias voltage.

5. The operational amplifier of claim 1, wherein the output signal is a differential signal including a positive signal and a negative signal; and the operational amplifier further comprises:
a common-mode feedback circuit, arranged to monitor a common-mode voltage of the positive signal and the negative signal, and compare the common-mode voltage with a reference voltage to generate a feedback control voltage, wherein the current controller is further arranged to receive the feedback control voltage, and affect the bias voltage input in response to the feedback control voltage.

6. The operational amplifier of claim 5, wherein the common-mode feedback circuit further comprises:
a Miller compensation circuit, coupled between the output signal and the bias voltage input.

7. A signal amplification method comprising:
generating a bias voltage input according to an input signal; and
amplifying, by a single-stage amplifier, the input signal to generate an output signal, wherein the single-stage amplifier comprises a voltage controlled current source circuit that operates in response to the bias voltage input;
wherein the bias voltage input comprises a first bias voltage, a second bias voltage, a third bias voltage, and a fourth bias voltage; and none of the first bias voltage, the second bias voltage, the third bias voltage, and the fourth bias voltage is directly set by the input signal of the single-stage amplifier.

8. The signal amplification method of claim 7, wherein the bias voltage input is dynamically adjusted in response to the input signal for enabling Class-AB slew-rate enhancement for the voltage controlled current source circuit.

9. The signal amplification method of claim 7, wherein the single-stage amplifier is a telescopic amplifier; and the voltage controlled current source circuit comprises:
- a first P-channel metal-oxide semiconductor (PMOS) transistor, having a gate node arranged to receive the first bias voltage, and a source node arranged to receive a first reference voltage;
- a second PMOS transistor, having a gate node arranged to receive the second bias voltage, and a source node arranged to receive the first reference voltage;
- a first N-channel metal-oxide semiconductor (NMOS) transistor, having a gate node arranged to receive the third bias voltage, and a source node arranged to receive a second reference voltage, wherein the second reference voltage is lower than the first reference voltage; and
- a second NMOS transistor, having a gate node arranged to receive the fourth bias voltage, and a source node arranged to receive the second reference voltage.

10. The signal amplification method of claim 9, wherein the input signal is a differential signal including a positive signal and a negative signal; and generating the bias voltage input according to the input signal comprises:
- when a voltage level of the positive signal is lower than a voltage level of the negative signal, increasing the first bias voltage and the third bias voltage, and decreasing the second bias voltage and the fourth bias voltage; and
- when the voltage level of the positive signal is higher than the voltage level of the negative signal, decreasing the first bias voltage and the third bias voltage, and increasing the second bias voltage and the fourth bias voltage.

11. The signal amplification method of claim 7, wherein the output signal is a differential signal including a positive signal and a negative signal; and the signal amplification method further comprises:
- monitoring a common-mode voltage of the positive signal and the negative signal; and
- comparing the common-mode voltage with a reference voltage to generate a feedback control voltage, wherein generation of the bias voltage input is affected by the feedback control voltage.

12. The signal amplification method of claim 11, further comprising:
- providing Miller compensation between the output signal and the bias voltage input.

\* \* \* \* \*